US006632685B2

(12) United States Patent
Chiu et al.

(10) Patent No.: US 6,632,685 B2
(45) Date of Patent: Oct. 14, 2003

(54) APPARATUS AND METHOD FOR DETERMINING VARIOUS PROCESSES OF WAFER FABRICATION IN A SEMICONDUCTOR DEVICE MANUFACTURING TECHNOLOGY

(75) Inventors: Cheng-Tsung Chiu, Hsinchu (TW); Peng-Chen Peng, Hsinchu Hsien (TW); Peter Lin, Changhua Hsien (TW); Jr-Ming Fang, Taipei (TW)

(73) Assignee: Mosel Vitelic Inc., Hsinchu (TW)

( * ) Notice: Subject to any disclaimer, the term of this patent is extended or adjusted under 35 U.S.C. 154(b) by 31 days.

(21) Appl. No.: 09/894,753

(22) Filed: Jun. 28, 2001

(65) Prior Publication Data

US 2002/0108893 A1 Aug. 15, 2002

(30) Foreign Application Priority Data

Feb. 9, 2001 (TW) .......................................... 90102874

(51) Int. Cl.[7] ........................... H01L 21/00; G01N 21/00
(52) U.S. Cl. ........................................ 438/7; 356/433
(58) Field of Search ........................... 438/5, 7, 16, 14; 700/121; 250/425; 356/432, 433

(56) References Cited

U.S. PATENT DOCUMENTS

| 4,658,960 A | * | 4/1987 | Iwasa | 206/459.1 |
| 5,979,756 A | * | 11/1999 | Ahn et al. | 235/383 |
| 6,303,398 B1 | * | 10/2001 | Goerigk | 438/14 |

FOREIGN PATENT DOCUMENTS

| JP | 63229810 A | * | 9/1988 | ........... H01L/21/02 |
| JP | 6-13453 | * | 1/1994 | ........... H01L/21/68 |

OTHER PUBLICATIONS

Web page product specifications for Keyence FU–77 and FS–V11, http://world.keyence.com/sensors/fiber_optics/fs_v10/fs_v10$_{13}$ spec.html (2 pages) and http://world.keyence.com/sensors/fiber_optics/fs_v10/fs_v10.html (6 pages).*

* cited by examiner

Primary Examiner—Evan Pert
(74) Attorney, Agent, or Firm—Birch, Stewart, Kolasch & Birch, LLP

(57) ABSTRACT

According to the present invention, an apparatus for determining various processes of wafer fabrication suitable for a plurality of various processes of wafer fabrication, having: a plurality of wafer cassettes, each having a distinct transparency, used in the various processes of wafer fabrication; a sensor-set, used to detect the distinct transparency of each of the wafer cassettes, and output a signal corresponding to the distinct transparency; and an amplifier, connected to the sensor-set to receive the signal, thus reading the distinct transparency, so as to determine the type of the wafer cassettes. Furthermore, a method for determining various processes of wafer fabrication includes the steps of: providing a plurality of wafer cassettes, each having a distinct transparency, used in the various processes of wafer fabrication; reading the distinct transparency of each of the wafer cassettes; and determining the type of the wafer cassettes according to the distinct transparency.

12 Claims, 1 Drawing Sheet

APPARATUS AND METHOD FOR DETERMINING VARIOUS PROCESSES OF WAFER FABRICATION IN A SEMICONDUCTOR DEVICE MANUFACTURING TECHNOLOGY

BACKGROUND OF THE INVENTION

1. Field of the Invention

The present invention relates to an apparatus for determining various processes of wafer fabrication, and more particularly to an apparatus for determining various processes of wafer fabrication in the semiconductor device manufacturing technology.

2. Background

The processes employed during the fabrication of semiconductor devices have become increasingly automated. Until recently, however, the transfer of semiconductor wafer cassettes among pieces of processing equipment has been a manual process involving a human operator. The processes of film deposition, diffusion and ion implantation, as well as lithography and etching are repeated for the semiconductor wafer manufacturing process. The continuous fabrication is usually adopted for mass production, that is, carrier belts are used to transfer semi-product into subsequent processing areas. In various processes of wafer fabrication, temperature, atmosphere, and pH are controlled to match certain conditions of each process. Wafers of various processes are put into wafer cassettes of different materials, such as anti-heat, anti-acid, anti-alkali, and anti-erosion types, according to individual requirements.

Sensors are usually set in the loading end of individual processing areas. The sensors are used to detect whether a wafer cassette is loaded, and then the wafer cassette is transferred to processing equipment via a manipulator or a human operator. Sensors in common use are interdicting types, detecting only whether a wafer cassette is loaded.

Occasionally, however, wafers are not located in the correct wafer cassettes due to human error. Consequently, wafers and equipment involved in the error are contaminated and the wafer cassettes are damaged. For example, polyetheretherketone (PEEK) anti-heat wafer cassettes are used in the diffusion process, and need to be exchanged for perfluoroalkoxy (PFA) anti-acid wafer cassettes for subsequent cleaning, but the wafer cassettes are sometimes not changed due to human error, thus causing numerous problems.

SUMMARY OF THE INVENTION

The object of the present invention is to solve the above-mentioned problems and to provide an apparatus and a method for determining various processes of wafer fabrication suitable for a plurality of various processes of wafer fabrication. Wafer cassettes of different materials have distinct transparencies. A sensor-set is added into the loading end of the individual processing area to determine the type of wafer cassettes, thereby preventing inappropriate wafer cassettes from entering unsuitable processing areas, and eliminating processing errors.

According to the present invention, an apparatus for determining various processes of wafer fabrication suitable for a plurality of various processes of wafer fabrication, comprising: a plurality of wafer cassettes, each having a distinct transparency, used in the various processes of wafer fabrication; a sensor-set, used to detect the distinct transparency of each of the wafer cassettes, and outputting a signal corresponding to the distinct transparency; and an amplifier, connected to the sensor-set for receiving the signal, thus obtaining the distinct transparency, so as to identify one of the wafer cassettes.

Furthermore, the invention proposes a method for determining various processes of wafer fabrication suitable for a plurality of various processes of wafer fabrication comprising the steps of: providing a plurality of wafer cassettes, each having a distinct transparency, using in the various processes of wafer fabrication; getting the distinct transparency of each of the wafer cassettes; and determining one of the wafer cassettes according to the distinct transparency.

BRIEF DESCRIPTION OF THE DRAWINGS

The present invention will be described in detail with reference to the illustrated embodiments and the accompany drawings, in which.

DETAILED DESCRIPTION OF THE PREFERRED EMBODIMENT

Figure 1:
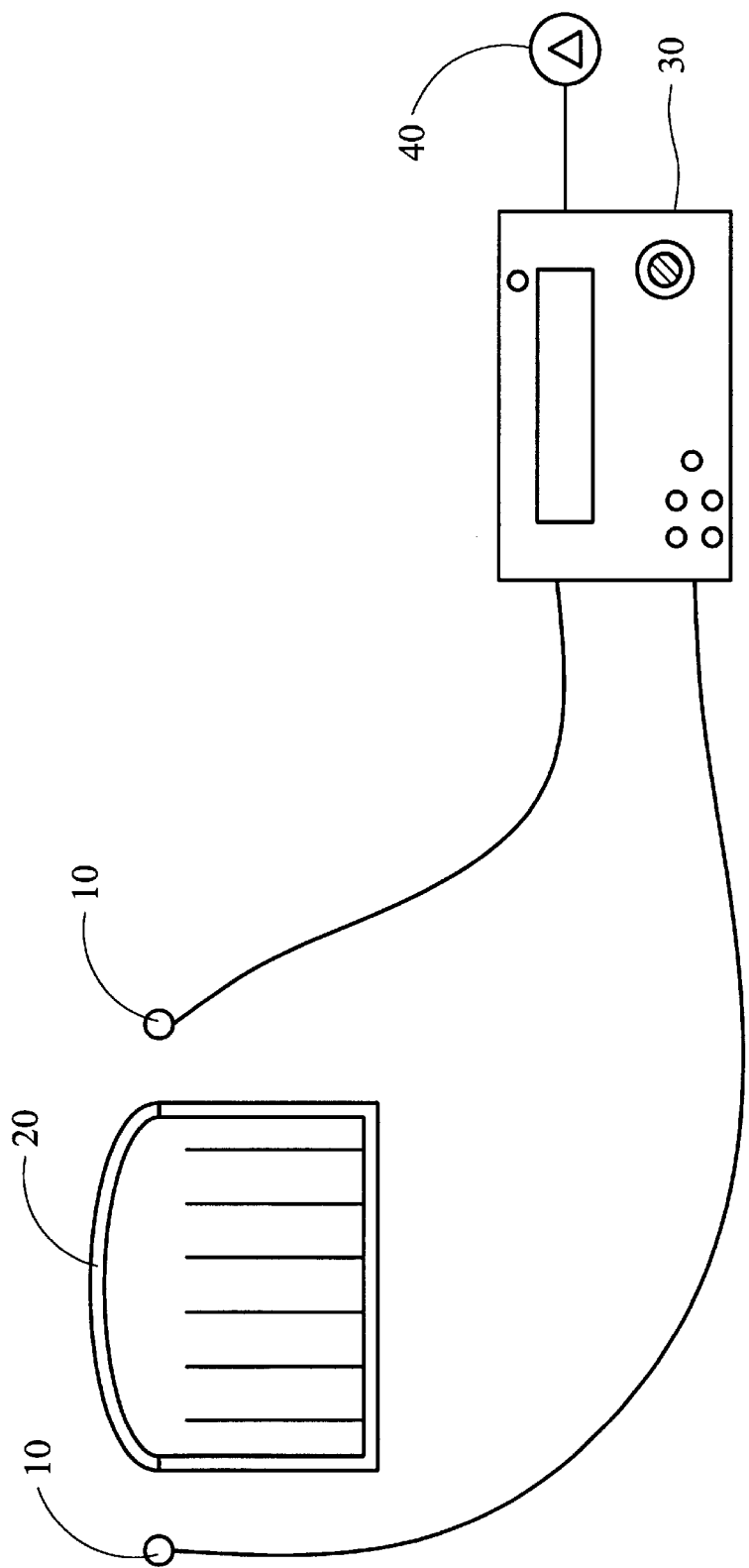
FIG. 1 is a schematic drawing illustrating the apparatus in the preferred embodiment.

An apparatus for determining various processes of wafer fabrication according to the preferred embodiment of the present invention will now be described.

FIG. 1 is a schematic drawing illustrating the apparatus in the preferred embodiment. As shown in FIG. 1, the apparatus includes a sensor-set 10 which is used for detecting a distinct transparency of a wafer cassette 20 and then outputting a signal corresponding to the distinct transparency. The sensor-set 10 can be comprised of, for example, the optical fiber sensor-set of KEYENCE FU-77. The apparatus still includes an amplifier 30 which is connected to the sensor-set 10 for receiving the signal, and thus obtains distinct transparency, thereby identifying the individual wafer cassette types. The amplifier 30 can be comprised of, for example, the amplifier of KEYENCE FS-V11. The apparatus in the preferred embodiment can further use an alarm 40, connected to the amplifier for the purpose of issuing a warning according to the preset transparency. The alarm 40 can be comprised of, for example, a warning light or buzzer.

A method for determining various processes of wafer fabrication suitable for a plurality of various processes of wafer fabrication according to the preferred embodiment of the present invention will now be described. First, a plurality of wafer cassettes is provided, each with a distinct transparency, and the wafer cassettes are used in the various processes of wafer fabrication. Then, the distinct transparency of each of the wafer cassettes is read. According to the distinctly identified transparency, one of the wafer cassettes is determined. The method for determining various processes of wafer fabrication according to the preferred embodiment of the present invention further comprises a step of issuing an alarm according to the presence of a predetermined transparency.

In a preferred embodiment, the step of reading the distinct transparency of each of the wafer cassettes is performed by a sensor-set. The sensor-set can be comprised of, for example, the optical fiber sensor-set of KEYENCE FU-77.

In a preferred embodiment, the step of determining one of the wafer cassettes according to the distinct transparency is performed by an amplifier. The amplifier can be comprised of, for example, the amplifier of KEYENCE FS-V11.

Practicing the apparatus according to the preferred embodiment of the present invention for the semiconductor wafer manufacturing process. To illustrate, polyetheretherketone (PEEK) anti-heat wafer cassettes of black are used for the diffusion process, and need to be exchanged for white perfluoroalkoxy (PFA) anti-acid wafer cassettes for the subsequent cleaning process. Accordingly, a sensor-set can be added into the loading end of the area of cleaning process to determine the types of wafer cassettes, thereby preventing PEEK wafer cassettes from entering the area of the cleaning process, and eliminating processing error.

While the invention has been described with reference to various illustrative embodiments, the description is not intended to be construed in a limiting sense. Various modifications of the illustrative embodiments, as well as other embodiments of the invention, will be apparent to those persons skilled in the art upon reference to this description. It is therefore contemplated that the appended claims will cover any such modifications or embodiments as may fall within the scope of the invention defined by the following claims and their equivalents.

What is claimed is:

1. An apparatus for determining various processes of wafer fabrication suitable for a plurality of various processes of wafer fabrication, comprising:

a plurality of wafer cassettes, each having a distinct transparency, used in the various processes of wafer fabrication;

a sensor-set, used to detect the distinct transparency of each of said wafer cassettes, and outputting a signal corresponding to the distinct transparency; and an amplifier, connecting to the sensor-set for receiving the signal thus reading the distinct transparency, so as to determine the types of the wafer cassettes.

2. The apparatus as recited in claim 1, further comprising an alarm, connected to the amplifier to issue an alarm according to a predetermined transparency.

3. The apparatus as recited in claim 1, wherein the sensor-set comprises the optical fiber sensor-set of KEYENCE FU-77.

4. The apparatus as recited in claim 1, wherein the amplifier comprises the amplifier of KEYENCE FS-V11.

5. A method for determining various processes of wafer fabrication suitable for a plurality of various processes of wafer fabrication comprising the steps of:

providing a plurality of wafer cassettes, each having a distinct transparency, used in the various processes of wafer fabrication;

reading the distinct transparency of each of the wafer cassettes; and determining the type of the wafer cassettes according to the distinct transparency.

6. The method as recited in claim 5, further comprising a step of issuing an alarm according to the presence of a predetermined transparency.

7. The method as recited in claim 5, wherein the step of reading the distinct transparency of each of the wafer cassettes is performed by a sensor-set.

8. The method as recited in claim 7, wherein the sensor-set comprises the optical fiber sensor-set of KEYENCE FU-77.

9. The method as recited in claim 5, wherein the step of determining the type of one of the wafer cassettes according to its distinct transparency is performed by an amplifier.

10. The method as recited in claim 9, wherein the amplifier comprises the amplifier of KEYENCE FS-V11.

11. The apparatus as recited in claim 1, wherein each of the wafer cassettes is made of a material and wherein the sensor-set detects the distinct transparency of each of the wafer cassettes through the material of the wafer cassettes.

12. The method as recited in claim 5, wherein each of the wafer cassettes is made of a material and the step of reading the distinct transparency of each of the wafer cassettes includes reading the transparency through the material of each of the wafer cassettes.

* * * * *